(12) United States Patent
Quek et al.

(10) Patent No.: US 8,446,779 B2
(45) Date of Patent: May 21, 2013

(54) NON-VOLATILE MEMORY USING PYRAMIDAL NANOCRYSTALS AS ELECTRON STORAGE ELEMENTS

(75) Inventors: Elgin Quek, Singapore (SG); Chunshan Yin, Singapore (SG); Shyue Seng Tan, Singapore (SG); Jae Gon Lee, Singapore (SG); Chung Foong Tan, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 183 days.

(21) Appl. No.: 12/583,486

(22) Filed: Aug. 21, 2009

(65) Prior Publication Data

US 2011/0044115 A1 Feb. 24, 2011

(51) Int. Cl.
*G11C 16/04* (2006.01)
*H01L 29/788* (2006.01)

(52) U.S. Cl.
USPC .......... 365/185.29; 365/185.18; 257/E29.3; 257/315; 977/943

(58) Field of Classification Search
None
See application file for complete search history.

(56) References Cited

U.S. PATENT DOCUMENTS

| | | | |
|---|---|---|---|
| 5,225,362 A | 7/1993 | Bergemont | |
| 6,657,893 B2 * | 12/2003 | Takahashi et al. | 365/185.15 |
| 2004/0214362 A1 * | 10/2004 | Hill et al. | 438/33 |
| 2004/0256662 A1 * | 12/2004 | Black et al. | 257/317 |
| 2007/0248818 A1 * | 10/2007 | Bensahel et al. | 428/357 |
| 2007/0298536 A1 * | 12/2007 | Ren et al. | 438/102 |

OTHER PUBLICATIONS

Jian-Hao Chen, et al., "Nonvolatile Memory Characteristics with Embedded Hemispherical Silicon Nanocrystals," Japanese Journal of Applied Physics, vol. 46, No. 10A, 2007, pp. 6586-6588.
A.L. Efros, et al., "Semiconductor Nanocrystals: From Basic Principles to Applications: Nanocrystalline Silicon-Silicon Dioxide Superlattices: Structural and Optical Properties," Springer 2003, pp. 209-219.
Chindalore, et al., "Embedded Split-Gate Flash Memory with Silicon Nanocrystals for 90nm and Beyond," 2008 Symposium on VLSI Technology Digest of Technical Papers, 2008 IEEE, pp. 136-137.
Tsybeskov, et al., "Nanocrystalline-silicon superlattice produced by controlled recrystallization," 1998 American Institute of Physics, Appl. Phys. Lett. 72(1), Jan. 5, 1998, pp. 43-45.

* cited by examiner

*Primary Examiner* — Hoai V Ho
*Assistant Examiner* — James G Norman
(74) *Attorney, Agent, or Firm* — Robert D. McCutcheon (57) ABSTRACT

A non-volatile memory device includes a floating gate with pyramidal-shaped silicon nanocrystals as electron storage elements. Electrons tunnel from the pyramidal-shaped silicon nanocrystals through a gate oxide layer to a control gate of the non-volatile memory device. The pyramidal shape of each silicon nanocrystal concentrates an electrical field at its peak to facilitate electron tunneling. This allows an erase process to occur at a lower tunneling voltage and shorter tunneling time than that of prior art devices.

9 Claims, 7 Drawing Sheets

NON-VOLATILE MEMORY USING PYRAMIDAL NANOCRYSTALS AS ELECTRON STORAGE ELEMENTS

TECHNICAL FIELD

The present disclosure relates generally to the manufacture of semiconductor devices, and more particularly, to the manufacture of integrated circuits having non-volatile memory devices.

BACKGROUND

Non-volatile memory (NVM) technology has faced challenges in attempting to improve the writing/reading speed and injection efficiency of hot carriers into the tunneling oxide of a memory cell. Non-volatile memory (NVM) devices that utilize a channel hot electron (CHE) injection process are inefficient. This inefficiency results in a low writing speed and a need for a large area to adequately perform a hot electron injection process. Non-volatile memory (NVM) devices that utilize a Fowler-Nordheim tunneling process are efficient. However, the Fowler-Nordheim tunneling process has a low read performance.

This means that there is a fundamental limit on the speed and scaling of conventional non-volatile memory (NVM) devices.

Figure 1:
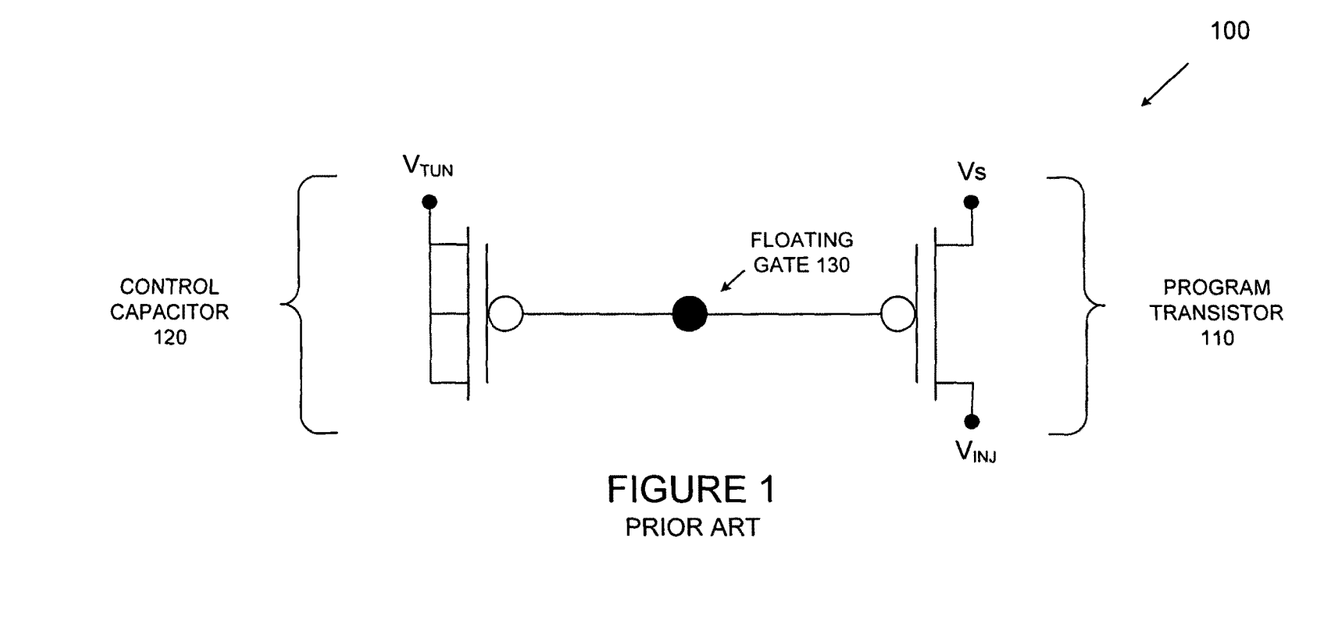
FIG. 1 illustrates a schematic diagram of a prior art memory cell of an electrically erasable programmable read only memory (EEPROM) device.

FIG. 1 illustrates a schematic diagram of a prior art memory cell 100 of an electrically erasable programmable read only memory (EEPROM) device. Memory cell 100 includes one P-channel metal oxide semiconductor (PMOS) transistor 110 and one P-channel metal oxide semiconductor (PMOS) capacitor 120. The PMOS capacitor 120 is formed by connecting together the source, drain and substrate of a PMOS transistor.

The PMOS transistor 110 may be referred to as PMOS program transistor 110, while the PMOS capacitor 120 may be referred to as PMOS control capacitor 120. The gate of the PMOS program transistor 110 and the gate of the PMOS control capacitor 120 are connected together (i.e., shorted together) and are isolated from the other active elements. The shorted gates of the PMOS program transistor 110 and the PMOS control capacitor 120 are collectively referred to as a "floating gate" 130. Charges (in amounts that represent either a zero ("0") representation or a one ("1") representation) may be written to the floating gate 130. In order to avoid well bias interference, the PMOS program transistor 110 and the PMOS control capacitor 120 are each located in a separate N well.

The prior art memory cell 100 is written to by injecting drain avalanche hot electrons into the floating gate 130. For PMOS operation (as shown in FIG. 1) a low voltage is applied to the control gate and drain of PMOS control capacitor 120 and a high voltage is applied to the source/well of PMOS program transistor 110. The channel of PMOS program transistor 110 is turned on and hot electrons are generated at the high electric field region at the drain junction (designated "$V_{INJ}$" in FIG. 1). With positive voltage on the control gate of PMOS control transistor 120, some hot electrons with high energy will pass through the silicon-silicon dioxide (Si—SiO$_2$) potential barrier and be injected into the floating gate 130.

The prior art memory cell 100 is erased by applying a high voltage to the control gate of the PMOS control transistor 120 and to the ground drain and source of the PMOS program transistor 110. Electrons on the floating gate 130 will pass through the gate oxide between the floating gate 130 and the control gate of the PMOS control capacitor 120 by Fowler-Nordheim (FN) tunneling process and into the substrate. A description of the physics of the Fowler-Nordheim (FN) tunneling process is set forth in U.S. Pat. No. 5,225,362, which is incorporated herein by reference.

Figure 2:
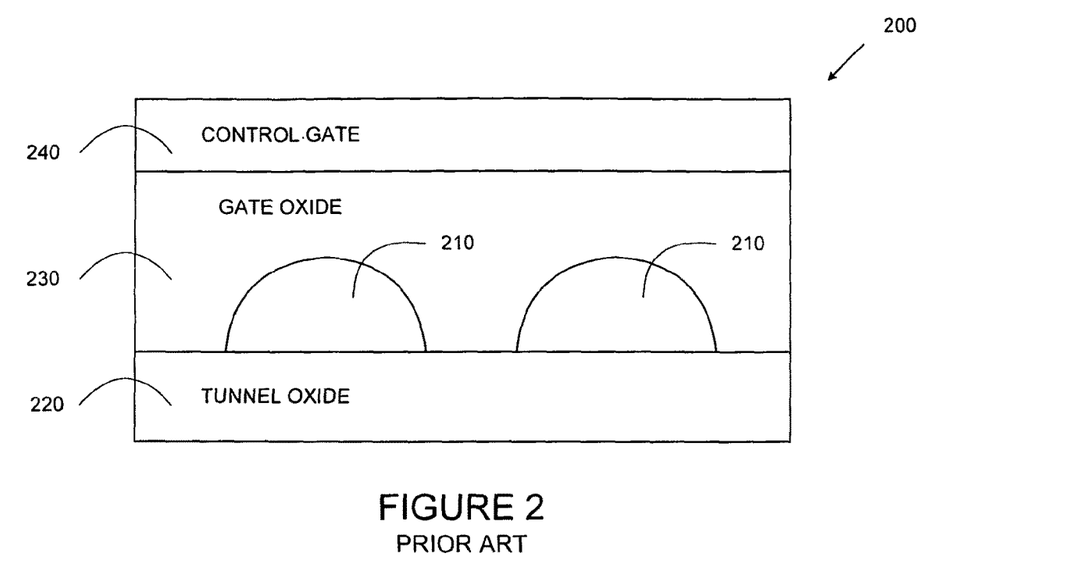
FIG. 2 is a diagram illustrating a cross sectional side view of a prior art structure having a plurality of hemispherical silicon nanocrystals on the surface of a tunnel oxide of a floating gate.

FIG. 2 illustrates a prior art structure 200 that illustrates the use of a plurality of silicon nanocrystals 210 on the surface of a tunnel oxide 220 grown on a silicon substrate. The silicon nanocrystals 210 function as the "floating gate." The tunnel oxide 220 and the silicon nanocrystals 210 are covered with a gate oxide 230. A control gate 240 is located above the gate oxide 230.

During the erase process, electrons will pass from the silicon nanocrystals 210 through the gate oxide 230 to the control gate 240 by the Fowler-Nordheim (FN) tunneling process. The silicon nanocrystals 210 facilitate the passage of the electrons through the gate oxide 230.

Prior art silicon nanocrystals 210 are typically either spherical or hemispherical. A typical hemispherical silicon nanocrystal geometry is shown in FIG. 2. The hemispherical silicon nanocrystal geometry exposes the largest cross-section to the tunnel oxide 220 and provides the most efficient charge injection from the substrate (not shown). The erase process is less efficient likely because the electric field is uniformly distributed on the top surface of the silicon nanocrystals 210.

Accordingly, there is a need in the art for an improved non-volatile memory (NVM) device (and method of manufacture) that increases the erase efficiency while at the same time maintaining the advantages that are provided by the hemispherical silicon nanocrystals.

SUMMARY

In accordance with one advantageous embodiment, a non-volatile memory device is provided that comprises a floating gate and a plurality of pyramidal silicon nanocrystals that are associated with the floating gate. Electrons are stored on the pyramidal silicon nanocrystals. When the non-volatile memory device performs an erase process, the electrons tunnel from the plurality of pyramidal silicon nanocrystals through a gate oxide layer to a control gate of the non-volatile memory device.

A peak at the top of each pyramidal silicon nanocrystal concentrates an electrical field at the peak to facilitate electron tunneling. This allows the erase process to be performed at a lower tunneling voltage and at a lower tunneling time than that of prior art devices.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art should appreciate that they may readily use the conception and the specific embodiment disclosed as a basis for modifying or designing other structures for carrying out the same purposes described herein. Those skilled in the art should also realize that such equivalent constructions do not depart from the spirit and scope of the present disclosure in its broadest form.

Before undertaking the Detailed Description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 3 through 11 and the various embodiments used to describe the principles of the present disclosure in this patent document are by way of illustration only and should not be construed in any way to limit the scope of the invention. Those skilled in the art will understand that these principles may be implemented in any type of suitably arranged non-volatile memory (NVM) device.

To simplify the drawings the reference numerals from previous drawings will sometimes not be repeated for structures that have already been identified.

To better provide a thorough explanation of the technical advantages, a general description of the manufacture of prior art hemispherical silicon nanocrystals will first be given.

Figure 3:
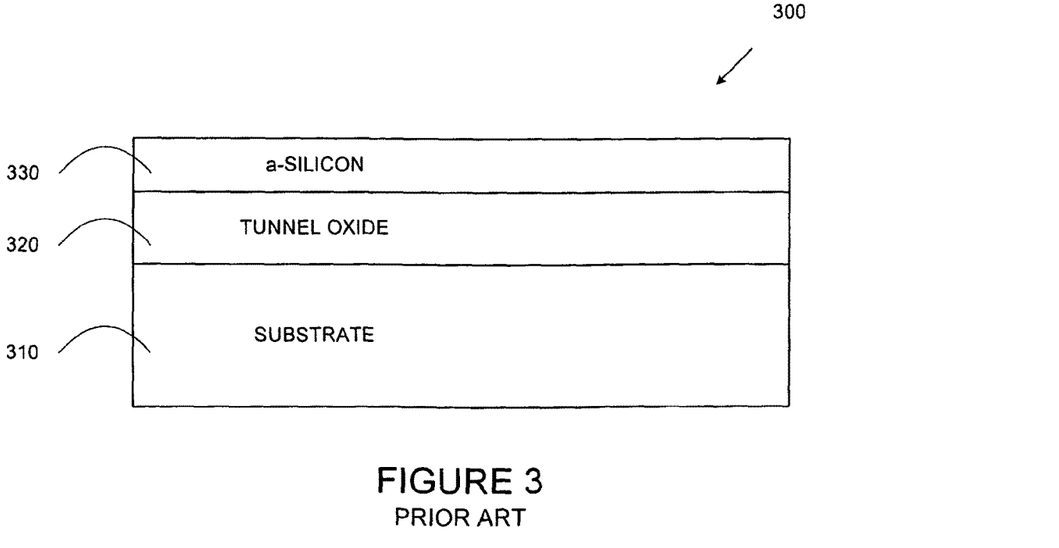
FIG. 3 is a diagram illustrating a cross sectional side view of a structure used to manufacture the plurality of prior art hemispherical silicon nanocrystals shown in FIG. 2.
Figure 4:
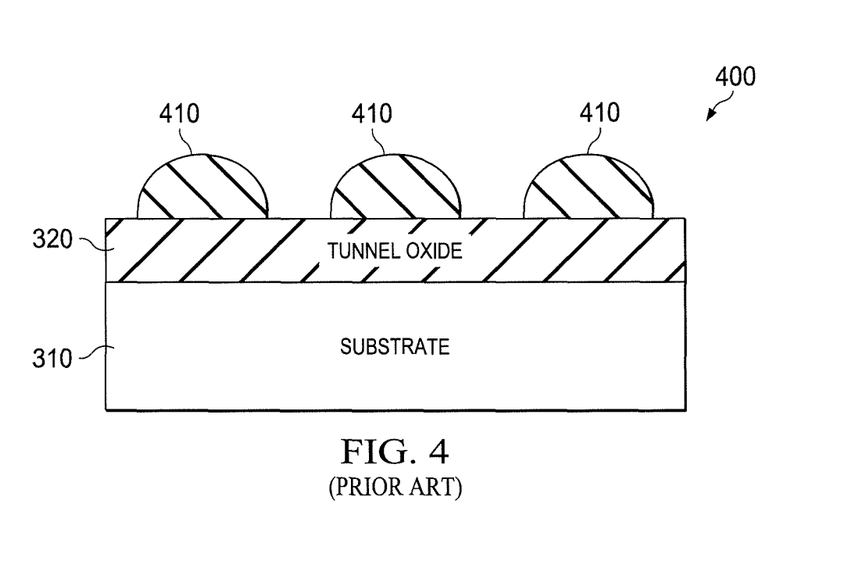
FIG. 4 is a diagram illustrating a cross sectional side view showing how a plurality of prior art hemispherical silicon nanocrystals are formed from the structure shown in FIG. 3.

FIG. 3 is a diagram illustrating a cross sectional side view of an intermediate structure 300 used in the manufacture of the prior art hemispherical silicon nanocrystals 210 shown in FIG. 2. A silicon substrate 310 is provided with a tunnel oxide layer 320 formed (e.g., grown) on or over the silicon substrate 310. A layer of amorphous silicon 330 (also referred to as a-silicon 330) is formed (e.g., deposited) over the tunnel oxide layer 320 and a rapid thermal anneal (RTA) process is performed to form a plurality of hemispherical silicon nanocrystals 410 by agglomeration, as shown in FIG. 4.

Figure 5:
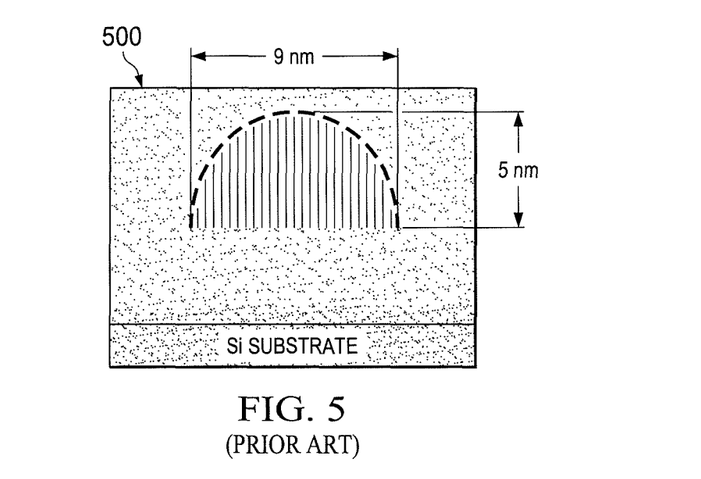
FIG. 5 is a transmission electron microscope (TEM) photograph of a prior art hemispherical silicon nanocrystal.

FIG. 5 is a transmission electron microscope (TEM) photograph of a prior art hemispherical silicon nanocrystal. As shown in FIG. 5, the length of the base of the hemispherical silicon nanocrystal is approximately nine nanometers (9 nm) and the height is approximately five nanometers (5 nm). In general, a pyramidal silicon nanocrystal may have a base that is in a range of approximately eight nanometers (8 nm) to fifteen nanometers (15 nm) and may have a height that is in a range of approximately eight nanometers (8 nm) to fifteen nanometers (15 nm).

Figure 6:
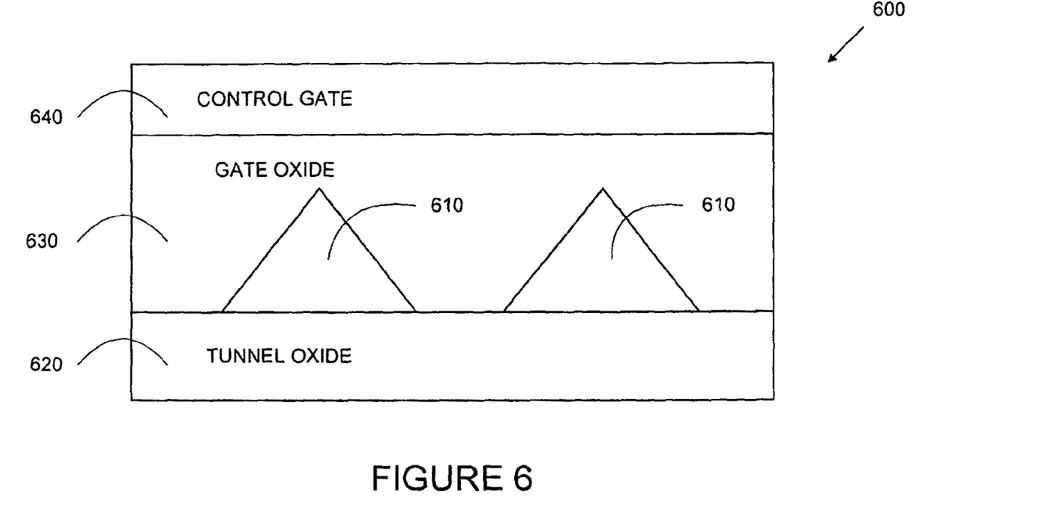
FIG. 6 is a diagram illustrating a cross sectional side view of a structure that illustrates a plurality of pyramidal silicon nanocrystals on the surface of a tunnel oxide of a floating gate in accordance with the present disclosure.

FIG. 6 is a diagram illustrating a cross sectional side view of a structure 600 that illustrates a plurality of pyramidal silicon nanocrystals 610 disposed on the surface of a tunnel oxide 620 of a floating gate. The tunnel oxide 620 and the pyramidal silicon nanocrystals 610 are covered with a gate oxide 630. A control gate 640 is positioned above the gate oxide 630. Because the silicon nanocrystals 610 are three dimensional structures they are described as being pyramidal. Transmission electron microscope (TEM) pictures show that the silicon nanocrystals 610 have a non-rounded point (or vertex) at the top. The silicon nanocrystals 610 can be generally described as polyhedral nanocrystals with an upwardly pointing vertex.

During the erase process, electrons present on the silicon nanocrystals will pass from the tips of pyramidal silicon nanocrystals 610 through the gate oxide 630 to the control gate 640 by the Fowler-Nordheim (FN) tunneling process. The configuration and structure of the pyramidal silicon nanocrystals 610 facilitate the passage of the electrons through the gate oxide 630.

The shape of the pyramidal silicon nanocrystals 610 provides a nanocrystal peak thereon which is located adjacent to the control gate 640. It will be appreciated that electrons are able to tunnel through the gate oxide 630 from a peak of a pyramidal silicon nanocrystal 610 at a lower applied voltage than required using the prior art hemispherical silicon nanocrystal 210. This is because of the concentration of field lines at the peak of the pyramidal silicon nanocrystal 610 and the control gate 640. In contrast, the electric field lines in the case of a prior art hemispherical silicon nanocrystal 210 are more uniformly distributed over the top surface of the hemispherical silicon nanocrystal 210. The pyramidal geometry facilitates electron tunneling and allows a reduction in erase voltage as compared to prior art erase voltages. This also allows the erase time to be reduced compared to prior art erase times.

In addition, it will be appreciated that the thickness of the gate oxide 630 may be chosen or selected to prevent program disturb and read disturb effects. The use of pyramidal-shaped silicon nanocrystals improves the efficiency of the erase process (in terms of lower erase voltages and lower erase times)

while essentially maintaining the advantages provided by the prior art hemispherical silicon nanocrystals 210.

Figure 7:
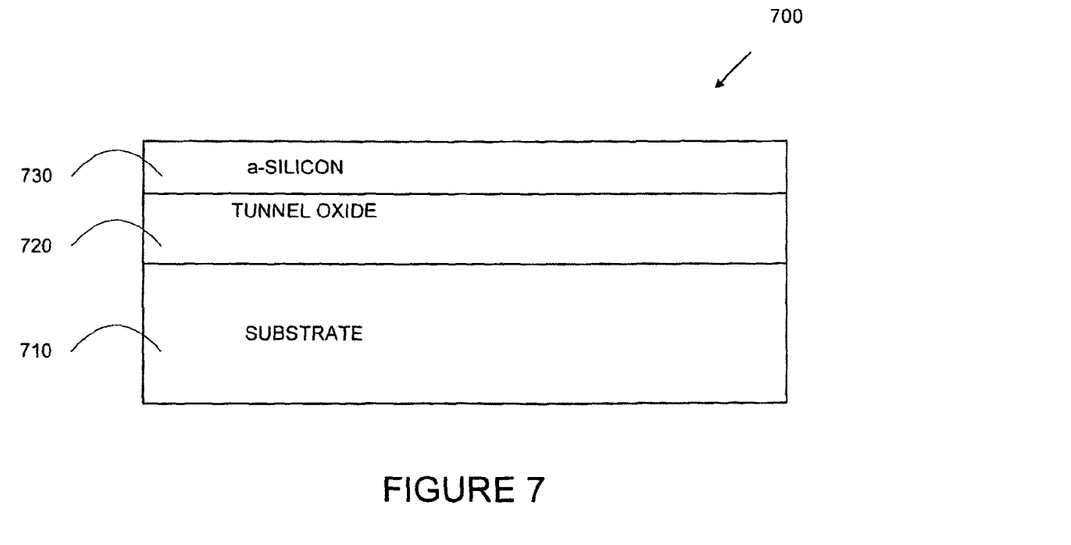
FIG. 7 is a diagram illustrating a cross sectional side view of a structure used to manufacture the plurality of pyramidal silicon nanocrystals shown in FIG. 6.

FIG. 7 is a diagram illustrating a cross sectional side view of an intermediate structure 700 used in the manufacture of the pyramidal-shaped silicon nanocrystals 610 shown in FIG. 6. A silicon substrate 710 is provided with a tunnel oxide layer 720 formed (e.g., grown) on or over the silicon substrate 710. A layer of a-silicon 730 is formed (e.g., deposited) over the tunnel oxide layer 720 to form the resulting structure 700, as shown in FIG. 7.

Figure 8:
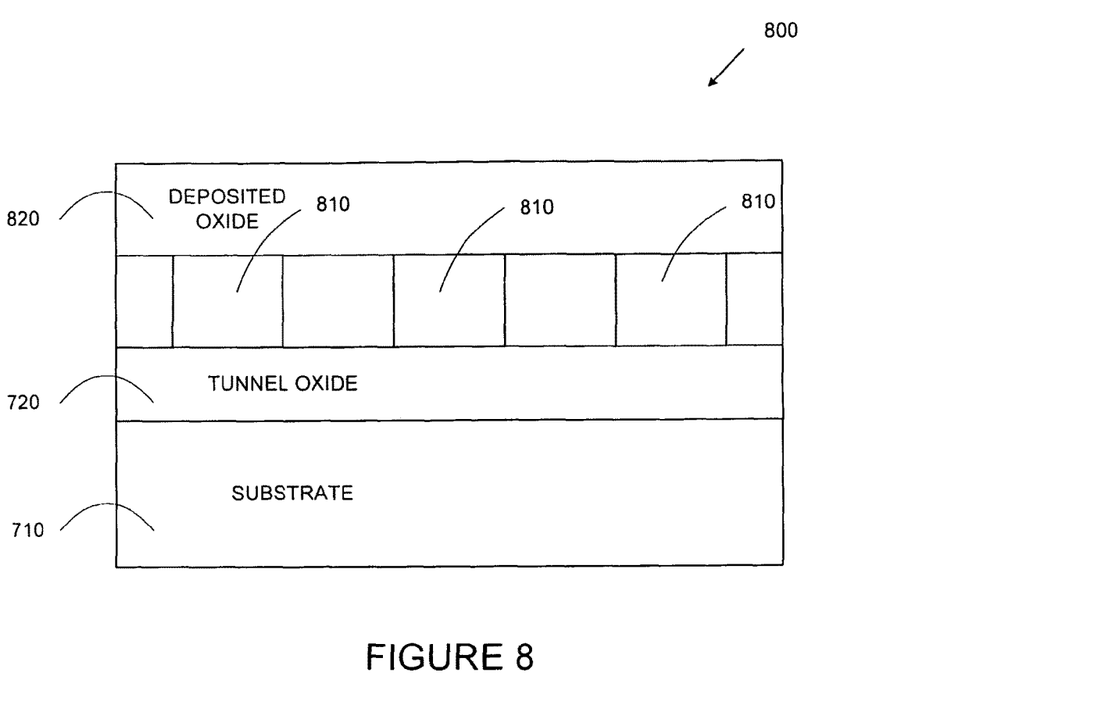
FIG. 8 is a diagram illustrating a cross sectional side view showing an intermediate step in the manufacture of a plurality of pyramidal silicon nanocrystals.

An oxide deposition process is performed to form a deposited oxide layer 820 over a plurality of brick-shaped (e.g., rectangular-shaped or rectangular cuboid) silicon nanocrystals 810, as shown in FIG. 8. The oxide deposition process is followed by a rapid thermal anneal (RTA) process and a furnace anneal. The a-silicon 730 and the tunnel oxide 720 can be sputtered or CVD deposited. The rapid thermal anneal (RTA) can be done at a temperature between eight hundred degrees Celsius (800° C.) and nine hundred degrees Celsius (900° C.) for up to sixty seconds (60 sec). The furnace anneal can be fifteen minutes (15 min) of annealing at a temperature of one thousand fifty degrees Celsius (1050° C.) During the anneal, the a-silicon 730 recrystallizes to form the nanocrystals 810.

Figure 9:
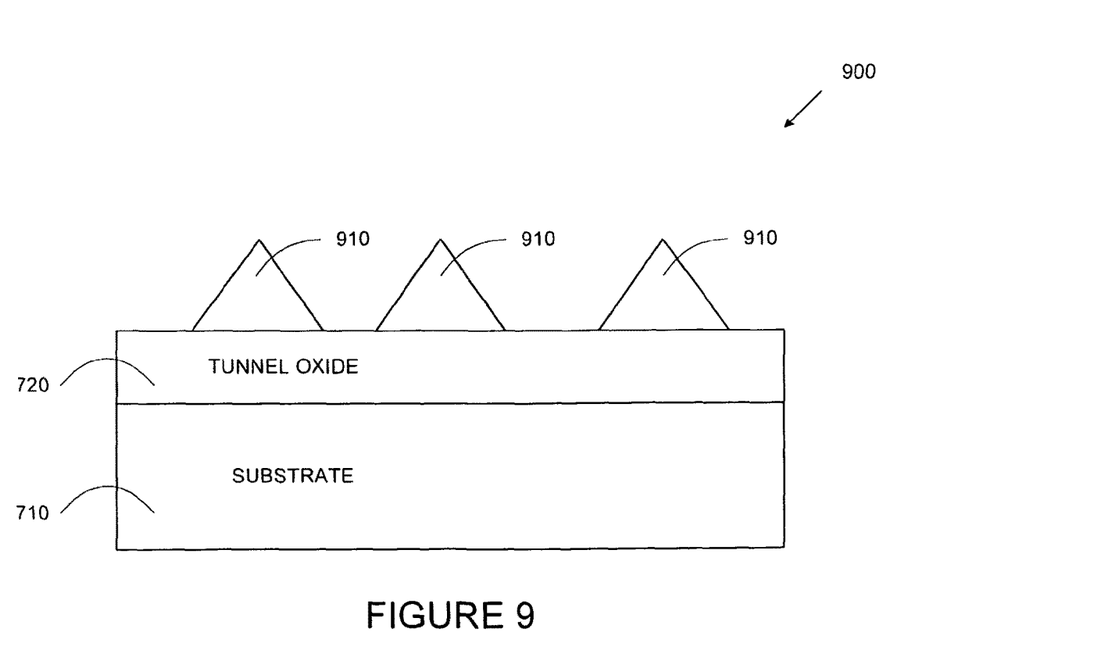
FIG. 9 is a diagram illustrating a cross sectional side view showing how a plurality of pyramidal silicon nanocrystals are formed from the structure shown in FIG. 8.

An anneal process, such as a steam anneal process, is performed to form the pyramidal-shaped silicon nanocrystals 910 from the brick-shaped (e.g., rectangular-shaped or rectangular cuboid) silicon nanocrystals 810. In one embodiment, the anneal process includes wet oxidation at a temperature of approximately nine hundred and fifty degrees Celsius (950° C.) in a fifteen to twenty percent (15%-20%) diluted water vapor for about fifteen minutes.

The resulting structure 900 and the resulting pyramidal-shaped silicon nanocrystals 910 after stripping off the top oxide are shown in FIG. 9. A gate oxide layer (not shown in FIG. 9) is then formed over the tunnel oxide 720 and the pyramidal silicon nanocrystals 910. A control gate layer (not shown in FIG. 9) is then formed over the gate oxide layer.

The sequence of processing as described herein is compatible with conventional processing for nanocrystal non-volatile memory (NVM) formation. The size of the pyramidal silicon nanocrystals 910 depends on the layer thicknesses and the anneal conditions. In one advantageous embodiment of the invention, the size and thickness of the pyramidal silicon nanocrystals 910 is approximately ten nanometers (10 nm).

Figure 10:
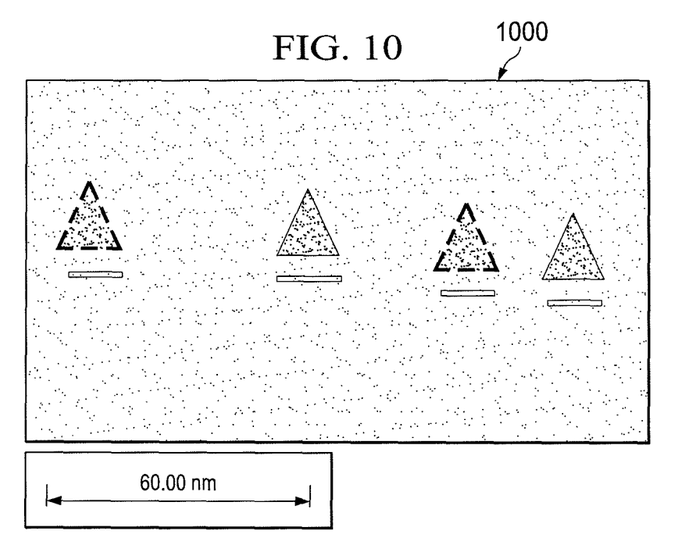
FIG. 10 is a transmission electron microscope (TEM) photograph of a plurality of pyramidal silicon nanocrystals.

FIG. 10 is a transmission electron microscope (TEM) photograph 1000 of a plurality of pyramidal silicon nanocrystals 610, 910. The pyramidal silicon nanocrystals 610, 910 shown in FIG. 10 are of a suitable size for non-volatile memory (NVM) applications. In one embodiment, the pyramidal silicon nanocrystals 610 have a base having a length of about twelve nanometers (12 nm) and a height of about fourteen nanometers (14 nm). Other suitable dimensions may be utilized.

Figure 11:
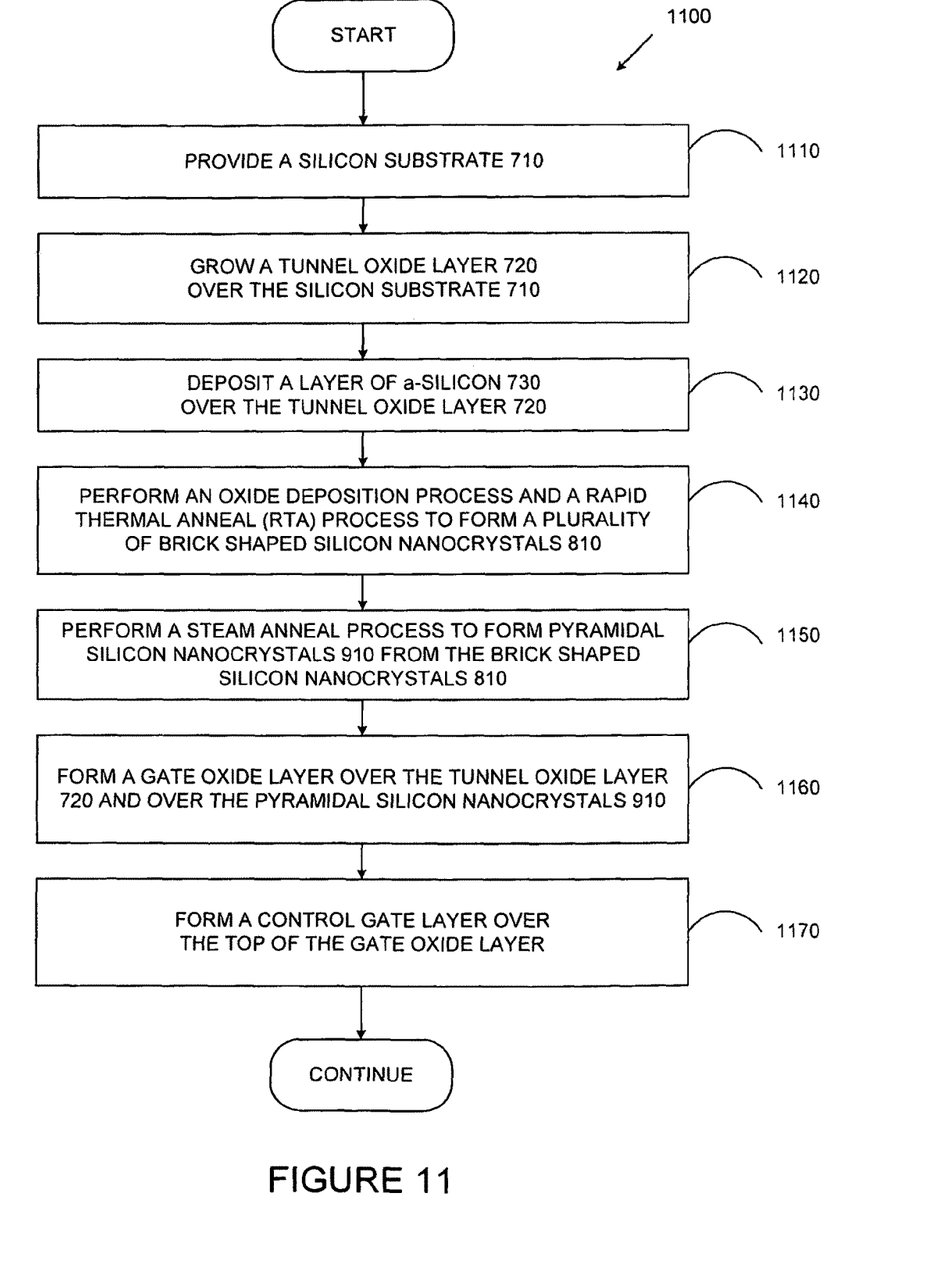
FIG. 11 is a diagram illustrating a flowchart of an advantageous embodiment of a method of manufacturing pyramidal silicon nanocrystals in accordance with the present disclosure.

FIG. 11 is a diagram illustrating a flowchart 1100 of an advantageous embodiment of a method of manufacturing the pyramidal silicon nanocrystals 610, 910. The flowchart 1100 summarizes the manufacturing steps that have been previously described.

A silicon substrate 710 is provided (step 1110), a tunnel oxide layer 720 is formed thereover (step 1120), and a layer of a-silicon 730 is formed over the tunnel oxide layer 720 (step 1130). A series of deposition and anneal steps is performed to form the pyramidal-shaped silicon nanocrystals. In one embodiment, this process includes an oxide deposition process and a rapid thermal anneal (RTA) process which forms a plurality of brick-shaped (e.g., rectangular-shaped or rectangular cuboid) silicon nanocrystals 810 (step 1140) and an anneal process (e.g., steam anneal) that subsequently forms the pyramidal-shaped silicon nanocrystals 910 from the brick-shaped (e.g., rectangular-shaped or rectangular cuboid) silicon nanocrystals (step 1150).

A gate oxide layer is formed over the tunnel oxide layer 720 and the pyramidal silicon nanocrystals 910 (step 1160) and a control gate layer is formed over the gate oxide layer (step 1170).

It will be understood that well known processes have not been described in detail and have been omitted for brevity. Although specific steps, structures and materials may have been described, the present disclosure may not be limited to these specifics, and others may be substituted as is well understood by those skilled in the art.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of operating a non-volatile memory device wherein the method comprises the steps of:
   providing at least one pyramidal silicon nanocrystal within a floating gate of the non-volatile memory device, the at least one pyramidal silicon nanocrystal formed during formation of the floating gate;
   performing an erase operation in which electrons tunnel through a gate oxide layer of the non-volatile memory device from the at least one pyramidal silicon nanocrystal;
   wherein the pyramidal silicon nanocrystal comprises an upward pointing peak that concentrates an electrical field at the peak of the pyramidal silicon nanocrystal; and
   wherein the peak of the pyramidal silicon nanocrystal allows electrons to tunnel through the gate oxide layer at a lower tunneling voltage than that required for electrons tunneling from a hemispherical silicon nanocrystal.

2. The method that is set forth in claim 1 wherein the peak of the pyramidal silicon nanocrystal allows electrons to tunnel through the gate oxide layer with a shorter tunneling time than that required for electrons tunneling from a hemispherical silicon nanocrystal.

3. The method as set forth in claim 1 wherein each of the plurality of pyramidal silicon nanocrystals has a base that is approximately twelve nanometers (12 nm) and a height that is approximately fourteen nanometers (14 nm).

4. A method of operating a non-volatile memory device, the method comprises:
   providing non-volatile memory device having a floating gate;
   providing within the floating gate a plurality of pyramidal silicon nanocrystals operable for storing electrons, the plurality of pyramidal silicon nanocrystals formed during formation of the floating gate;
   performing an erase operation in which the electrons tunnel through a gate oxide layer of the non-volatile memory device from the plurality of pyramidal silicon nanocrystals;
   wherein each of the plurality of pyramidal silicon nanocrystals comprises an upward pointing peak that concentrates an electrical field at the peak of the pyramidal silicon nanocrystal; and wherein the peaks of the pyramidal silicon nanocrystals allow electrons to tunnel through the gate oxide layer at a lower tunneling voltage than that required for electrons tunneling from a hemispherical silicon nanocrystal.

5. The method that is set forth in claim 4 wherein the peaks of the pyramidal silicon nanocrystals allow electrons to tunnel through the gate oxide layer with a shorter tunneling time than that required for electrons tunneling from a hemispherical silicon nanocrystal.

6. A method of forming a floating gate structure of a non-volatile memory device, the method comprising:
   forming a tunnel oxide layer on a silicon substrate;
   depositing amorphous silicon over the tunnel oxide layer;
   forming a plurality of silicon nanocrystals from the amorphous silicon,
   shaping each of the plurality of silicon nanocrystals into a pyramidal shape by performing a wet oxidation anneal process;
   forming a gate oxide layer over the pyramidal shaped silicon nanocrystals to form a floating gate; and
   forming a control gate layer over the floating gate.

7. The method as set forth in claim 6 wherein forming the plurality of silicon nanocrystals comprises:
   depositing oxide over the amorphous silicon; and
   performing a thermal anneal process to form the silicon nanocrystals.

8. The method as set forth in claim 7 wherein performing a thermal anneal process comprises:
   performing a rapid thermal anneal process; and
   performing a furnace anneal.

9. The method as set forth in claim 8 wherein the rapid thermal anneal process is to a temperature of between about 800 degrees Celsius and about 900 degrees Celsius.

* * * * *